United States Patent
Kuo et al.

(10) Patent No.: US 12,482,685 B2
(45) Date of Patent: *Nov. 25, 2025

(54) APPARATUS AND METHODS FOR AUTOMATICALLY HANDLING DIE CARRIERS

(71) Applicant: Taiwan Semiconductor Manufacturing Co., Ltd., Hsin-Chu (TW)

(72) Inventors: Tsung-Sheng Kuo, Hsin-Chu (TW); Cheng-Lung Wu, Hsin-Chu (TW); Chih-Hung Huang, Hsin-Chu (TW); Yang-Ann Chu, Hsin-Chu (TW); Hsuan Lee, Tainan (TW); Jiun-Rong Pai, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 507 days.

This patent is subject to a terminal disclaimer.

(21) Appl. No.: 17/984,096

(22) Filed: Nov. 9, 2022

(65) Prior Publication Data

US 2023/0063707 A1    Mar. 2, 2023

Related U.S. Application Data

(63) Continuation of application No. 16/886,115, filed on May 28, 2020, now Pat. No. 11,508,596.

(51) Int. Cl.
*H01L 21/67* (2006.01)
*H01L 21/677* (2006.01)
*G03F 1/66* (2012.01)

(52) U.S. Cl.
CPC .. *H01L 21/67742* (2013.01); *H01L 21/67745* (2013.01); *H01L 21/67754* (2013.01);
(Continued)

(58) Field of Classification Search
CPC ......... H01L 21/67781; H01L 21/67754; H01L 21/67757
See application file for complete search history.

(56) References Cited

U.S. PATENT DOCUMENTS

| | | |
|---|---|---|
| 5,180,273 A | 1/1993 | Sakaya et al. |
| 5,482,068 A | 1/1996 | Kitahara et al. |

(Continued)

FOREIGN PATENT DOCUMENTS

| | | |
|---|---|---|
| CN | 1802222 A | 7/2006 |
| CN | 110828355 A | 2/2020 |

(Continued)

*Primary Examiner* — Ronald P Jarrett
(74) *Attorney, Agent, or Firm* — The Marbury Law Group, PLLC

(57) ABSTRACT

Apparatus and methods for automatically handling die carriers are disclosed. In one example, a disclosed apparatus includes: at least one load port each configured for loading a die carrier operable to hold a plurality of dies; and an interface tool coupled to the at least one load port and a semiconductor processing unit. The interface tool comprises: a first robotic arm configured for transporting the die carrier from the at least one load port to the interface tool, and a second robotic arm configured for transporting the die carrier from the interface tool to the semiconductor processing unit for processing at least one die in the die carrier.

20 Claims, 9 Drawing Sheets

(52) U.S. Cl.
CPC .......... *H01L 21/67757* (2013.01); *G03F 1/66* (2013.01); *H01L 21/67772* (2013.01)

(56) References Cited

U.S. PATENT DOCUMENTS

| | | |
|---|---|---|
| 2001/0017192 A1 | 8/2001 | Hwang et al. |
| 2002/0150449 A1 | 10/2002 | Nelson et al. |
| 2003/0051972 A1 | 3/2003 | Davis |
| 2003/0051973 A1 | 3/2003 | Davis |
| 2019/0247900 A1 | 8/2019 | Park et al. |
| 2020/0161160 A1 | 5/2020 | Kuo et al. |
| 2021/0202277 A1 | 7/2021 | Kuo et al. |

FOREIGN PATENT DOCUMENTS

| | | |
|---|---|---|
| CN | 111099093 A | 5/2020 |
| CN | 111128797 A | 5/2020 |
| EP | 1867590 A1 | 12/2007 |
| JP | 4886745 B2 | 2/2012 |
| KR | 20200107529 A | 9/2020 |
| TW | 201912549 A | 4/2019 |

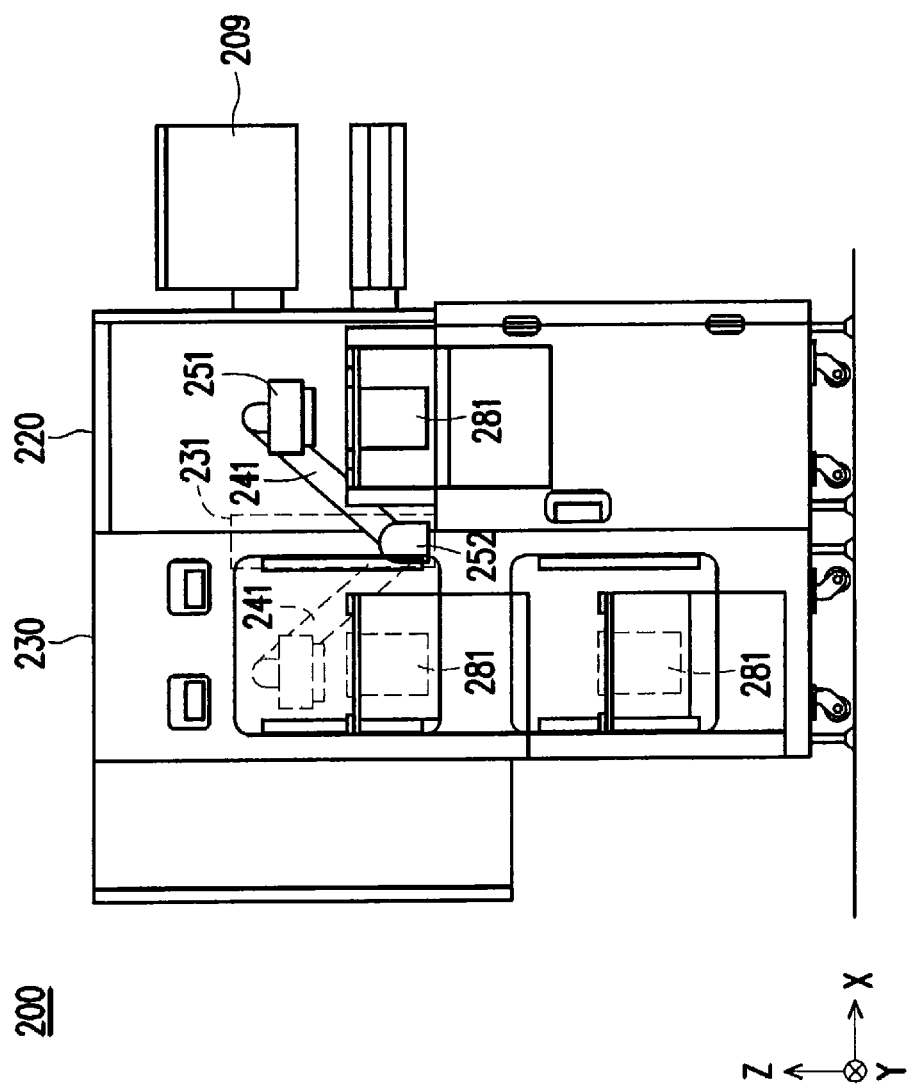

APPARATUS AND METHODS FOR AUTOMATICALLY HANDLING DIE CARRIERS

CROSS-REFERENCE TO RELATED APPLICATION

The present application is a continuation application of U.S. patent application Ser. No. 16/886,115, filed May 28, 2020, now U.S. Pat. No. 11,508,596, which is incorporated by reference herein in its entirety.

BACKGROUND

During manufacturing of a semiconductor device, the device is usually processed at many work stations or processing machines. For example, integrated circuits are produced in large batches on a single wafer, which can be cut into many pieces each of which contains one copy of the circuit and is called a die. Multiple dies can be held on a frame, called frame cassette.

The transporting or conveying of a die carrier, e.g. a frame cassette, is an important aspect in the total manufacturing process. While an automated material handling system (AMHS) may be used to automatically transport frame cassettes between various processing machines ("tools"), human operation is conventionally required to load a frame cassette into a processing tool and unload a frame cassette from a processing tool. As such, a huge human resource is needed to transfer frame cassettes in fabrication facility, which often causes injury of human operators. In addition, a production throughput is limited when manual operation causes process interruption during frame cassette transportation.

As such, existing apparatus and methods for handling die carriers are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIG. 2B illustrates a front view block diagram of the exemplary system for handling die carriers shown in FIG. 2A, in accordance with some embodiments of the present disclosure.

DETAILED DESCRIPTION

Figure 1A:
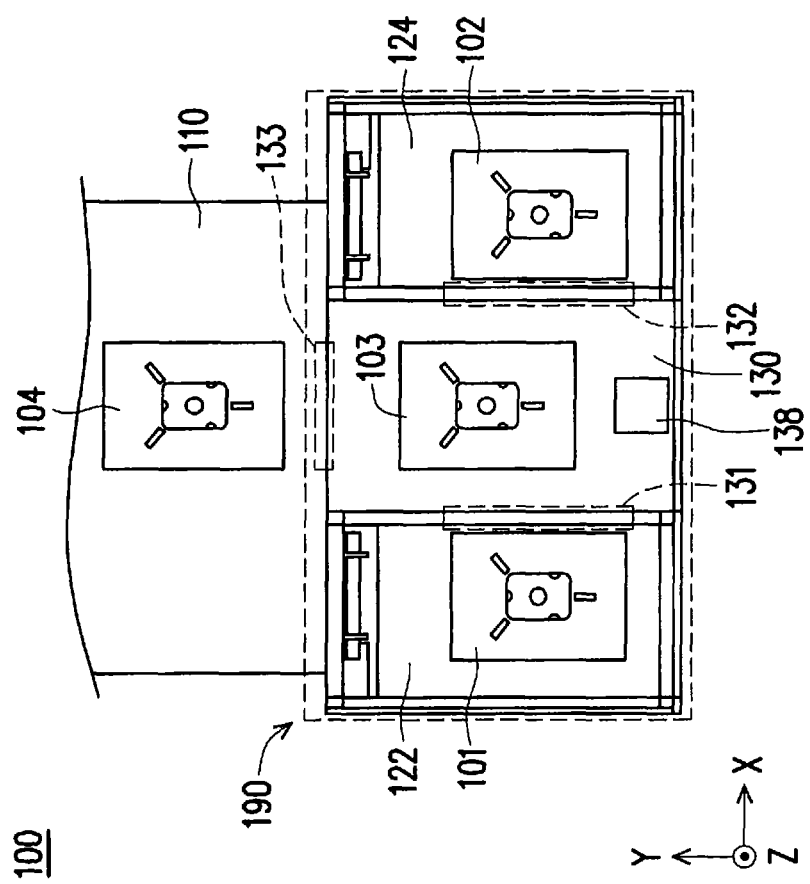
FIG. 1A illustrates a top view block diagram of an exemplary system for handling die carriers, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

An integrated circuit (IC) manufacturing may go through a plurality of production steps, during which carriers are used to support and carry the manufactured wafers and dies. The carriers for carrying device dies may include boats, trays, glass carriers, magazines, frames, etc. In one embodiment, multiple dies can be carried on a frame, while multiple frames can be carried in a frame cassette before and after the dies are processed at a processing tool. To save human resource, a load port may be used to load and unload die carriers during the IC manufacturing.

To further improve work efficiency and production quality in a semiconductor fabrication facility, the present teaching discloses apparatus and methods for automatically load and unload a die carrier, e.g. a frame cassette, to and from a processing tool for processing the dies in the frame cassette, with robotic arms in cooperation with an elevator for handling the die carrier.

In some embodiments, a disclosed apparatus includes: a load port configured for loading a die carrier operable to hold a plurality of dies; and an interface tool coupled to the load port and a semiconductor processing unit. The interface tool includes: a first robotic arm configured for transporting the die carrier from the load port to an elevator stage of the interface tool, and a second robotic arm configured for transporting the die carrier from the elevator stage of the interface tool to the semiconductor processing unit for processing at least one die in the die carrier. The elevator stage can automatically convey the die carrier vertically within the interface tool, which is an elevator zone of the apparatus. Each of the first robotic arm and the second robotic arm is one of: a shutter arm that has a shutter end effector configured for grabbing and holding a handle on top of the die carrier to move the die carrier horizontally and vertically; a clamp arm that has a clamp end effector configured for wrapping around an entirety of the die carrier to move the die carrier horizontally and vertically; or a shaking arm that has a first end and a second end, wherein the first end is configured for clamping on the die carrier to swing the die carrier around the second end.

The disclosed apparatus may also include a semiconductor wafer information detector to detect wafer information of a frame cassette being loaded, and communicate the semiconductor wafer information with other load ports or with a central controller of the fabrication facility. This can help to report loading issues timely to avoid processing errors.

The present disclosure is applicable to all kinds of devices that load or unload die carriers, e.g. in a bumping or packaging product. The disclosed system can improve work efficiency, saves human operation resources and improves production quality by reducing human errors on the manufacturing floor, avoiding human injury during a manual frame cassette load/unload process. The disclosed apparatus provides an elevator structure with robotic arms for automatically handling die carrier to generate a maximum production capacity. In one embodiment, the disclosed apparatus serves as a frame cassette load port to provide an interface between an overhead hoist transport (OHT) system or another cassette mobile system and semiconductor processing tools.

Figure 1B:
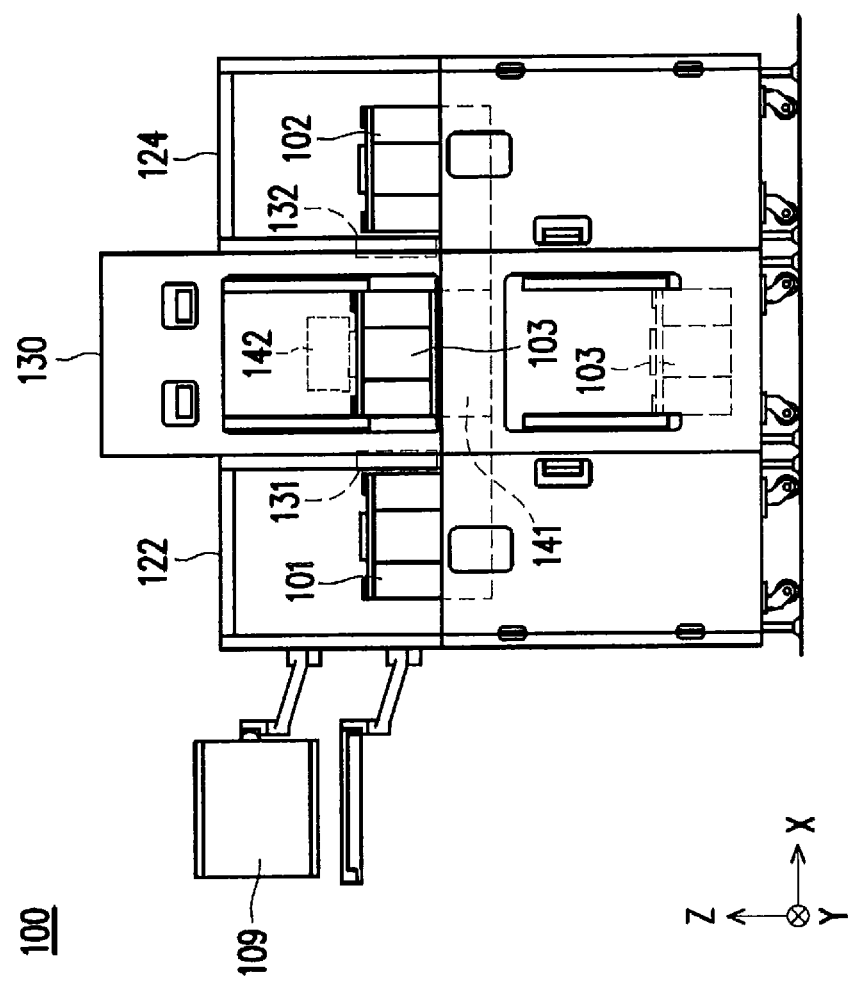
FIG. 1B illustrates a front view block diagram of the exemplary system for handling die carriers shown in FIG. 1A, in accordance with some embodiments of the present disclosure.
Figure 1C:
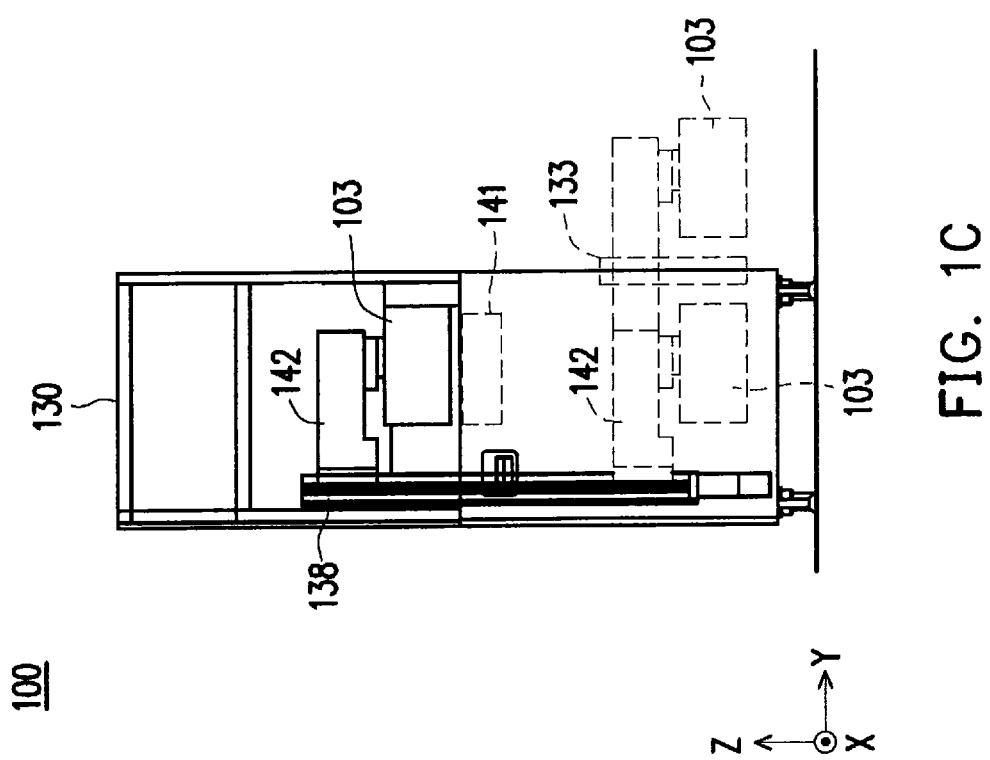
FIG. 1C illustrates a side view block diagram of the exemplary system for handling die carriers shown in FIG. 1A, in accordance with some embodiments of the present disclosure.

FIG. 1A illustrates a top view block diagram of an exemplary system 100 for handling die carriers, in accordance with some embodiments of the present disclosure. FIG. 1B illustrates a front view block diagram of an exemplary system 100 for handling die carriers shown in FIG. 1A, in accordance with some embodiments of the present disclosure. FIG. 1C illustrates a side view block diagram of the exemplary system 100 for handling die carriers shown in FIG. 1A, in accordance with some embodiments of the present disclosure.

As shown in FIG. 1A, the exemplary system 100 includes a semiconductor processing unit 110 and a carrier loading apparatus 190 interfaced with the semiconductor processing unit 110. The semiconductor processing unit 110 may be any device or system for processing semiconductor substrates and/or dies. The carrier loading apparatus 190 may provide dies in a die carrier 104 to the semiconductor processing unit 110 for processing. In one embodiment, the die carrier is a frame cassette comprising a plurality of frames each of which is operable to hold a plurality of dies.

As shown in FIG. 1A, the carrier loading apparatus 190 in this example includes an interface tool 130 and two load ports 122, 124. The two load ports 122, 124 are coupled to opposite sides of the interface tool 130, respectively. Each of the two load ports 122, 124 is configured for loading a die carrier operable to hold a plurality of dies. For example, the load port 122 may receive a die carrier 101 from an automated materials handling system (AMHS) vehicle; and the load port 124 may receive a die carrier 102 from the AMHS vehicle.

In the illustrated embodiment, the load port 122 and the interface tool 130 are connected via a first interface 131, such that a die carrier may be transported through the first interface 131 between the load port 122 and the interface tool 130. Similarly, the load port 124 and the interface tool 130 are connected via a second interface 132, such that a die carrier may be transported through the second interface 132 between the load port 124 and the interface tool 130.

After receiving a die carrier 103 from either the load port 122 or the load port 124, the interface tool 130 may transport the die carrier 103 to the semiconductor processing unit 110 through an interface 133 connecting the interface tool 130 and the semiconductor processing unit 110. In the illustrated embodiment, a die carrier is transported between the load ports 122, 124 and the interface tool 130 automatically by a first robotic arm. Similarly, the die carrier is transported between the interface tool 130 and the semiconductor processing unit 110 by a second robotic arm. According to various embodiments, each of the first robotic arm and the second robotic arm may be one of: a shutter arm, a clamp arm, or a shaking arm. A shutter arm has a shutter end effector configured for grabbing and holding a handle on top of the die carrier to move the die carrier horizontally and vertically. A clamp arm has a clamp end effector configured for wrapping around an entirety of the die carrier to move the die carrier horizontally and vertically. A shaking arm has a first end and a second end, where the first end is configured for clamping on the die carrier to swing the die carrier around the second end.

As shown in FIG. 1B, the interface tool 130 includes a first robotic arm 141 configured for transporting the die carrier from the load ports 122, 124 to the interface tool 130. The first robotic arm 141 can hold a die carrier 101 or 102, and move it horizontally along the X direction. That is, the first robotic arm 141 can move a die carrier from a load port 122 or 124 to the interface tool 130 through the first interface 131 or 132 before die processing, and/or move a die carrier from the interface tool 130 to the load port 122 or 124 along the X direction through the first interface 131 or 132 after die processing. In one embodiment, the first robotic arm 141 can hold a handle on top of the die carrier to move the die carrier horizontally. In another embodiment, the first robotic arm 141 has a support stage under the die carrier to hold the die carrier to move the die carrier horizontally.

As shown in FIG. 1A and FIG. 1C, the interface tool 130 also includes an elevator 138 configured for moving the die carrier 103 in the interface tool 130 vertically along the Z direction. In the illustrated embodiment, while the interfaces 131, 132 are located at an upper region of the interface tool 130 as shown in FIG. 1B, the interface 133 is located at a lower region of the interface tool 130 as shown in FIG. 1C. As such, after the first robotic arm 141 transports a die carrier 103 from the load port 122 or 124 to the upper region of the interface tool 130, the elevator 138 will move the die carrier 103 vertically along the Z direction to a lower position aligned with the interface 133, which is an entrance to the semiconductor processing unit 110.

In one embodiment, the first robotic arm 141 may be coupled to the elevator 138 to hold the die carrier to move the die carrier vertically. In one embodiment, the first robotic arm 141 can hold a handle on top of the die carrier to move the die carrier vertically. In another embodiment, the first robotic arm 141 has a support stage under the die carrier to hold the die carrier to move the die carrier vertically. In this case, the support stage of the first robotic arm 141 is also the elevator stage of the elevator 138.

As shown in FIG. 1C, the interface tool 130 also includes a second robotic arm 142 configured for transporting the die carrier 103 from the interface tool 130 to the semiconductor processing unit 110. To be specific, the second robotic arm 142 may hold the die carrier 103 and move it along the Y direction through the interface 133 into the semiconductor processing unit 110 for processing dies. In one embodiment, the second robotic arm 142 can hold a handle on top of the die carrier to move the die carrier horizontally and vertically. In another embodiment, the second robotic arm 142 has a clamp end effector configured for wrapping around an entirety of the die carrier to move the die carrier horizontally and vertically.

Referring again to FIG. 1B, in one embodiment, the load ports 122, 124 may be treated as an OHT zone of the carrier loading apparatus 190 for loading and unloading die carriers in cooperation with the OHT system and for performing door storage functions, while the interface tool 130 may be treated as an elevator zone of the carrier loading apparatus 190 for performing carrier transportation and carrier feeding functions. Each of the load ports 122, 124 may be a multi-cassette load port (MCLP).

In one embodiment, each of the load ports 122, 124 includes an opening mechanism configured to open a first door of the loaded die carrier; and a door storage configured to store the first door before the die carrier is transported to the interface tool 130. After the dies in the die carrier are processed by the semiconductor processing unit 110, the second robotic arm 142 is further configured for transporting the die carrier from the semiconductor processing unit 110 back to the interface tool 130. The first robotic arm 141 is further configured for transporting the die carrier from the interface tool 130 to the load port 122 or 124, which further includes a closing mechanism. The closing mechanism may be configured to retrieve a second door having a same model as the first door from the door storage, and to close the second door onto the die carrier, which may be transported to another processing tool later.

In another embodiment, one of the load port 122 or 124 is configured for loading die carriers, while the other one is configured for unloading die carriers. In yet another embodiment, after the dies in the die carrier are processed by the semiconductor processing unit 110, the die carrier is transported by another carrier loading apparatus to another semiconductor processing unit for further processing.

As such, the process of handling the die carriers in the fabrication facility may be performed in an automatic manner without human intervention unless there is an error report or system warning. For example, a monitor 109 may display the operation process within the load ports 122, 124 and the interface tool 130. The monitor 109 may also display key parameters related to the die carrier operation process and report an error when something abnormal happens, e.g. when wafer information detected on the die carrier does not match a code associated with the semiconductor processing unit 110.

While the interface tool 130 in FIGS. 1A-1C has a double-layer elevator structure to store multiple frame cassettes by Z-axis movement, systems in other embodiments may include an interface tool with a single-layer elevator structure or an N-layer elevator structure, where N>2. While the interface tool 130 in FIGS. 1A-1C has one single interface 133 connecting the interface tool 130 and the semiconductor processing unit 110, systems in other embodiments may include an interface tool with multiple interfaces or entrances to the semiconductor processing tool. As such, multiple frame cassettes may be transported from the elevator zone into a chamber of the semiconductor processing tool according to different pipelines of the chamber.

Figure 2A:
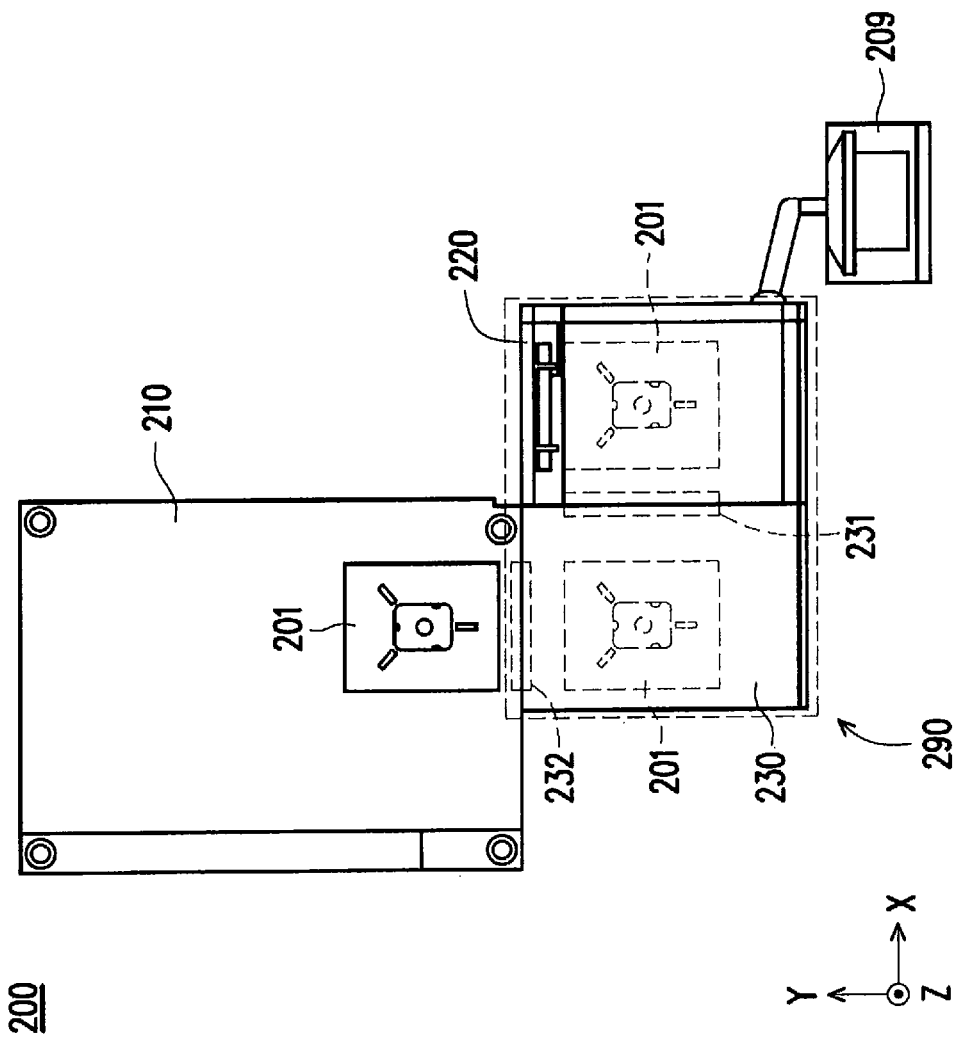
FIG. 2A illustrates a top view block diagram of another exemplary system for handling die carriers, in accordance with some embodiments of the present disclosure.
Figure 2C:
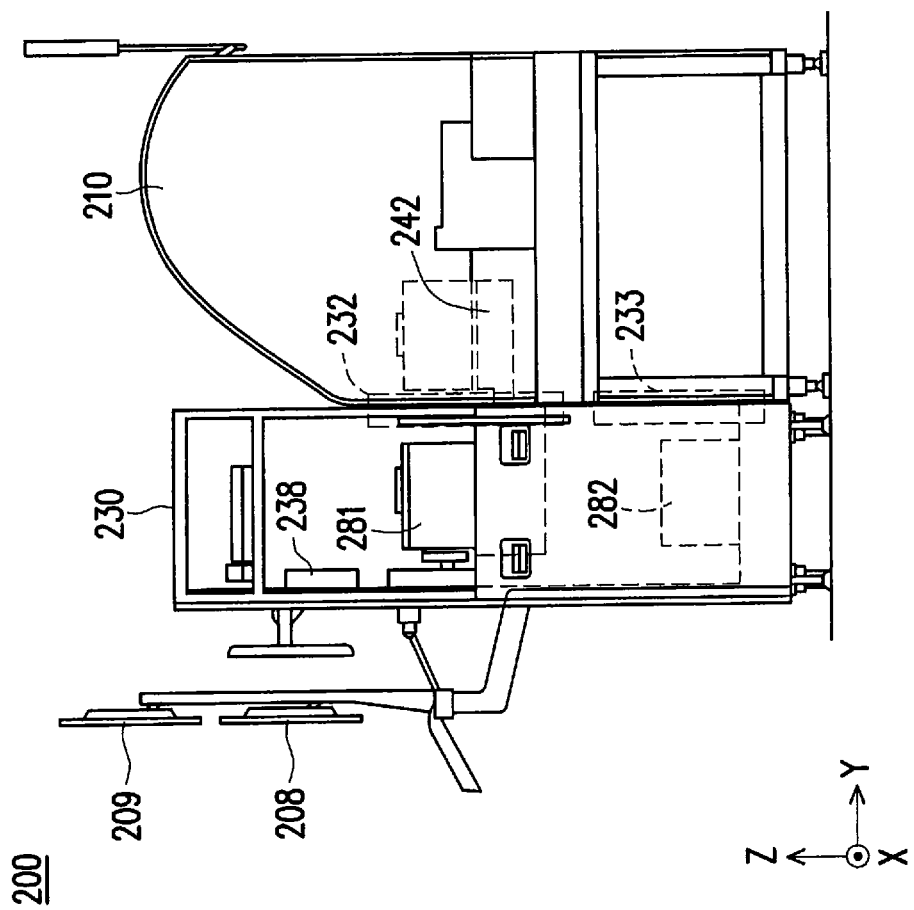
FIG. 2C illustrates a side view block diagram of the exemplary system for handling die carriers shown in FIG. 2A, in accordance with some embodiments of the present disclosure.

FIG. 2A illustrates a top view block diagram of another exemplary system 200 for handling die carriers, in accordance with some embodiments of the present disclosure. FIG. 2B illustrates a front view block diagram of the exemplary system 200 for handling die carriers shown in FIG. 2A, in accordance with some embodiments of the present disclosure. FIG. 2C illustrates a side view block diagram of the exemplary system 200 for handling die carriers shown in FIG. 2A, in accordance with some embodiments of the present disclosure.

As shown in FIG. 2A, the exemplary system 200 includes a semiconductor processing unit 210 and a carrier loading apparatus 290 interfaced with the semiconductor processing unit 210. The semiconductor processing unit 210 may be any device or system for processing semiconductor substrates and/or dies. The carrier loading apparatus 290 may provide dies in a die carrier 201 to the semiconductor processing unit 210 for processing. In one embodiment, the die carrier is a frame cassette comprising a plurality of frames each of which is operable to hold a plurality of dies. As shown in FIG. 2A, the carrier loading apparatus 290 in this example includes an interface tool 230 and a load port 220. The load port 220 is coupled to a right side, i.e. to the X direction, of the interface tool 230. The load port 220 is configured for loading a die carrier operable to hold a plurality of dies. For example, the load port 220 may receive a die carrier 201 from an AMHS vehicle.

In the illustrated embodiment, the load port 220 and the interface tool 230 are connected via a first interface 231, such that a die carrier may be transported through the first interface 231 between the load port 220 and the interface tool 230. After receiving a die carrier 201 from the load port 220, the interface tool 230 may transport the die carrier 201 to the semiconductor processing unit 210 through an interface 232 connecting the interface tool 230 and the semiconductor processing unit 210. In the illustrated embodiment, a die carrier is transported between the load port 220 and the interface tool 230 automatically by a first robotic arm; and the die carrier is transported between the interface tool 230 and the semiconductor processing unit 210 by a second robotic arm. According to various embodiments, each of the first robotic arm and the second robotic arm may be one of: a shutter arm, a clamp arm, or a shaking arm.

As shown in FIG. 2B, the interface tool 230 includes a first robotic arm 241 configured for transporting the die carrier 281 between the load port 220 and the interface tool 230. The first robotic arm 241 has a first end 251 and a second end 252. The second end 252 is fixed to a position in the proximity of the first interface 231, and the first end 251 is configured for clamping on the die carrier 281 to swing the die carrier 281 around the second end 252. The first end 251 may clamp on the entire die carrier 281 to move it around the second end 252. In one embodiment, the first end 251 may has a three-prong pin to grab the die carrier 281 in a secure way. In the illustrated embodiment, the die carrier 281 is transported by the first robotic arm 241 from the load port 220 to the interface tool 230 horizontally along the X direction through the first interface 231 before die processing. The die carrier 281 may also be transported by the first robotic arm 241 from the interface tool 230 to the load port 220 horizontally along the X direction through the first interface 231 after die processing.

As shown in FIG. 2C, the interface tool 230 also includes an elevator 238 configured for moving the die carrier 281 in the interface tool 230 vertically along the Z direction. In one embodiment, the interface tool 230 includes both the interface 232 connecting an upper region of the interface tool 230 to the semiconductor processing unit 210, and another interface 233 connecting a lower region of the interface tool 230 to the semiconductor processing unit 210. While the interfaces 231, 232 are located at the upper region of the interface tool 230 as shown in FIG. 2B, FIG. 2C, the interface 233 is located at the lower region of the interface tool 230 as shown in FIG. 2C. As such, after the first robotic arm 241 transports the die carrier 281 from the load port 220 to the upper region of the interface tool 230, the die carrier 281 may be fed into the semiconductor processing unit 210 through either the upper entrance 232 or the lower entrance 233 of the semiconductor processing unit 210. The elevator 238 may move the die carrier 281 vertically along the Z direction to a position aligned with the upper entrance 232 or the lower entrance 233 to the semiconductor processing unit 210. In one embodiment, multiple frame cassettes may be transported from the interface tool 230 into a chamber of the semiconductor processing tool 210 through the upper entrance 232 and the lower entrance 233 according to different pipelines of the chamber.

As shown in FIG. 2C, the interface tool 230 also includes a second robotic arm 242 configured for transporting the die carrier 281 from the interface tool 230 to the semiconductor processing unit 210. To be specific, the second robotic arm 242 may hold the die carrier 281 and move it along the Y direction through the interface 232 (or the interface 233) into the semiconductor processing unit 210 for processing dies. In one embodiment, the second robotic arm 242 can hold a handle on top of the die carrier 281 to move the die carrier 281 horizontally and vertically. In another embodiment, the second robotic arm 242 has a support stage under the die carrier 281 to hold the die carrier 281 to move the die carrier 281 horizontally and vertically. In this case, the second robotic arm 242 may be coupled to the elevator 238 to hold the die carrier to move the die carrier vertically; and the support stage of the second robotic arm 242 is also the elevator stage of the elevator 238. A shutter arm like the second robotic arm 242 can save space and may be used for a semiconductor processing tool with limited space.

Referring again to FIG. 2B, in one embodiment, the load port 220 may be treated as an OHT zone of the carrier loading apparatus 290 for loading and unloading die carriers in cooperation with the OHT system and for performing door storage functions, while the interface tool 230 may be treated as an elevator zone of the carrier loading apparatus 290 for performing carrier transportation and carrier feeding functions. The load port 220 may be a multi-cassette load port (MCLP). In one embodiment, the load port 220 includes an opening mechanism configured to open a first door of the die carrier loaded; and a door storage configured to store the first door before the die carrier is transported to the interface tool 230. After the dies in the die carrier are processed by the semiconductor processing unit 210, the second robotic arm 242 is further configured for transporting the die carrier from the semiconductor processing unit 210 back to the interface tool 230. The first robotic arm 241 is further configured for transporting the die carrier from the interface tool 230 to the load port 220, which further includes a closing mechanism. The closing mechanism may be configured to retrieve a second door having a same model as the first door from the door storage, and to close the second door onto the die carrier, which may be transported to another processing tool later. In another embodiment, after the dies in the die carrier are processed by the semiconductor processing unit 210, the die carrier is transported by another carrier loading apparatus to another semiconductor processing unit for further processing.

As such, the process of handling the die carriers in the fabrication facility may be performed in an automatic manner without human intervention unless there is an error report or system warning. For example, two monitors 209, 208 may display the operation process within the load port 220 and the interface tool 230, display key parameters related to the die carrier operation process and report an error when something abnormal happens.

While the interface tool 230 in FIGS. 2A-2C has a double-layer elevator structure to store multiple frame cassettes by Z-axis movement, systems in other embodiments may include an interface tool with a single-layer elevator structure or an N-layer elevator structure, where N>2. While the interface tool 230 in FIGS. 2A-2C has two interfaces 232, 233 connecting the interface tool 230 and the semiconductor processing unit 210, systems in other embodiments may include an interface tool with another number of interfaces or entrances to the semiconductor processing tool.

Figure 3:
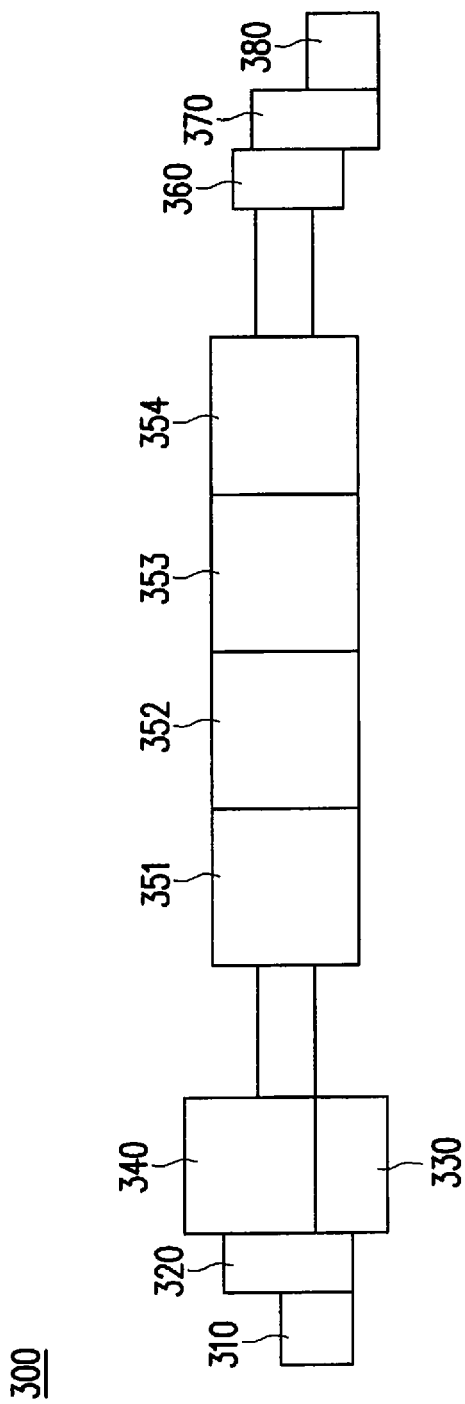
FIG. 3 illustrates a schematic diagram of a semiconductor fabrication facility equipped with semiconductor processing units for processing substrates and/or dies, in accordance with some embodiments of the present disclosure.

FIG. 3 illustrates a schematic diagram of a semiconductor fabrication facility 300 equipped with semiconductor processing units for processing substrates and/or dies, in accordance with some embodiments of the present disclosure. FIG. 3 shows a scenario where a carrier loading apparatus 330 is utilized to feed frame cassettes into a semiconductor processing tool 340. The carrier loading apparatus 330 serves as a frame cassette load port (FCLP) which may have a structure same as that of the carrier loading apparatus 190 in FIGS. 1A-1C or the carrier loading apparatus 290 in FIGS. 2A-2C.

At the far left side of FIG. 3, a load port 320 in this example serves as an entry point for feeding trays and boats into the semiconductor processing tool 340, while the carrier loading apparatus 330 serves as an entry point for feeding the frame cassettes into the semiconductor processing tool 340. For example, the load port 320 may receive boats/trays containing substrates from an AMHS or OHT vehicle 310, which may also convey frame cassette including dies to the carrier loading apparatus 330. In one embodiment, after the semiconductor processing tool 340 receives both the dies and the substrates, it may process them, e.g. by putting the dies on the substrates and adding a substance like a brazing material to adhere the two together, to form a die-substrate package. The die-substrate package may be moved through some chambers 351, 352, 353, 354, where the die-substrate package is baked or brazed so as to have them adhere to each other. The processed parts may be moved to a calibrator 360 to calibrate the boat die objects, e.g. by putting them back in a proper place in case they moved off the conveyor belt. An assembler 370 may perform a final assembly of the processed parts onto boats/trays, and another AMHS or OHT vehicle 380 at the far right of FIG. 3 may transport the boats/trays to next processing station.

Figure 4:
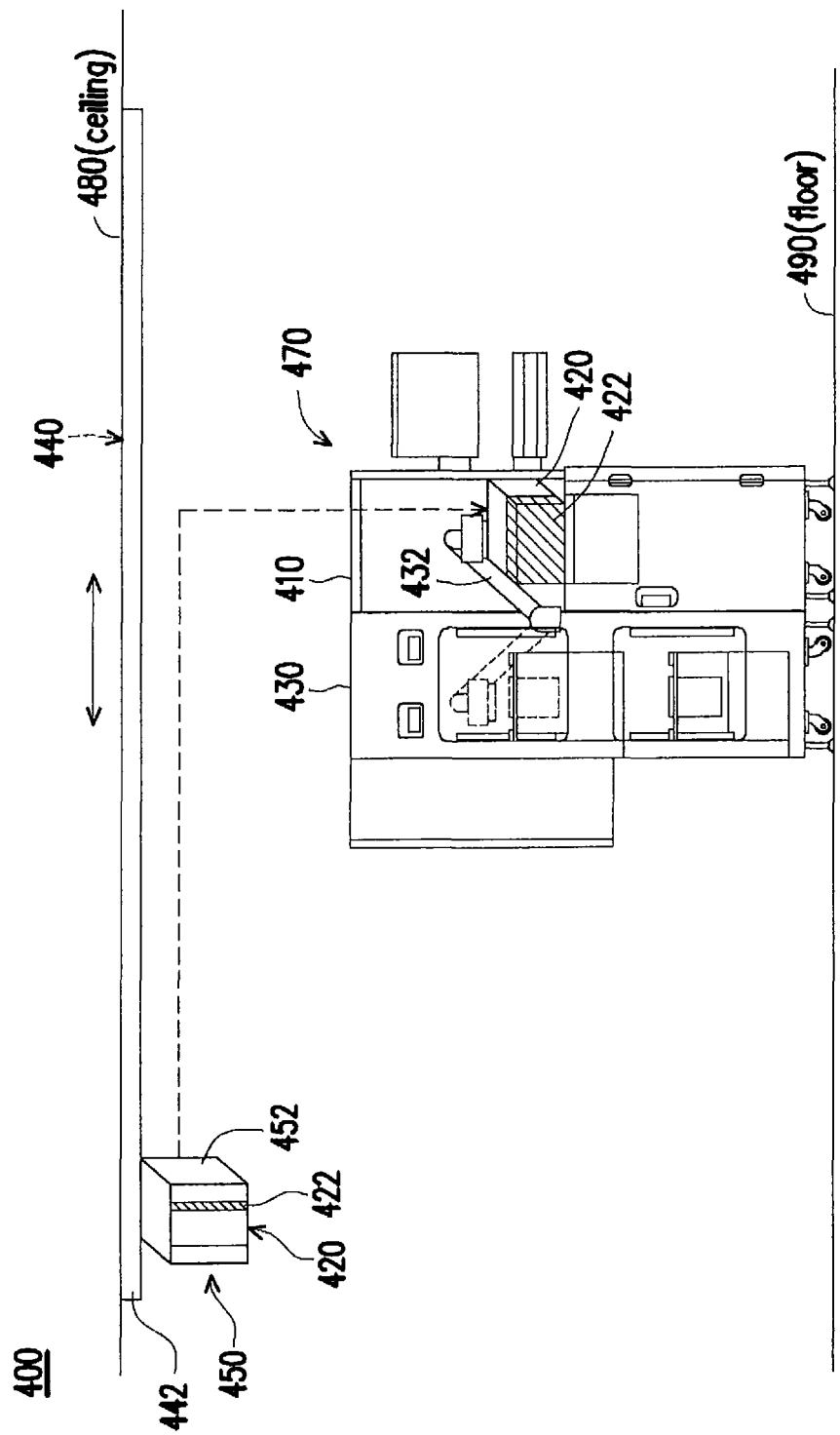
FIG. 4 illustrates a portion of a semiconductor fabrication facility including a carrier transport tool and a carrier loading apparatus, in accordance with some embodiments of the present disclosure.

FIG. 4 illustrates a portion of a semiconductor fabrication facility 400 including a carrier transport tool 440 and a carrier loading apparatus 470, in accordance with some embodiments of the present disclosure. The portion of the semiconductor fabrication facility 400 shown in FIG. 4 may be a schematic perspective diagram of an automatic material handling system (AMHS). As shown in FIG. 4, the AMHS includes a wafer transport tool 440, e.g. an OHT system, and a carrier loading apparatus 470, which may be any carrier loading apparatus as disclosed above in accordance with FIGS. 1-3, e.g. an FCLP. The carrier loading apparatus 470 in this example includes a load port 410 coupled to an interface tool 430, which includes a shaking robotic arm 432 for grabbing and moving a die carrier between the load port 410 and the interface tool 430. The shaking robotic arm 432 may work similar to the first robotic arm 241 shown in FIG. 2B.

In one example, the OHT system 440 includes a network of stationary tracks or rails 442 operable to guide the movement of one or more wheeled OHT vehicles 450 supported and suspended from the rails 442. In some embodiments, the rails 442 are monorails that are mounted to and suspended from the ceiling 480 and/or walls of the semiconductor fabrication facility. Rails 442 may have any suitable cross-sectional configuration as will be appreciated by those in the art so long as the OHT vehicle 450 are appropriately supported from the rail 442 for rolling motion.

An OHT vehicle 450 is operable to transport a die carrier 420 having a door 422 through the semiconductor fabrication facility 400 for intra-bay or inter-bay movement. The OHT vehicle 450 is configured and structured to hold a die carrier 420 housing a plurality of dies and transport the die carrier 420 in a generally horizontal or lateral direction from one location to another within the semiconductor fabrication facility 400.

The OHT vehicle 450 is configured and operable to pick up, raise/lower, hold, articulate, and release a die carrier 420. In one embodiment, the OHT vehicle 450 includes a motor-driven or pneumatic hoisting mechanism 452 generally comprised of gripper assembly including one or more retractable and extendable gripper arms having a gripper on the end thereof configured for locking onto a mating hook or flange on the die carrier 420. The hoisting mechanism 452 is operable to vertically raise and lower the gripper and attached die carrier 420.

As shown in FIG. 4, the OHT vehicle 450 can hold the die carrier 420, transport the die carrier 420 along the rail 442, and release the die carrier 420 onto the table of the load port 410. The load port 410 can automatically open and store the door 422 of the die carrier 420. The interface tool 430 can automatically move the die carrier 420 from the load port 410 into the interface tool 430 and then feed the die carrier 420 into a processing tool to process at least one die in the die carrier 420, in a manner similar to what have been described in FIGS. 1-3. In some embodiments, there are multiple processing tools in the semiconductor fabrication facility 400, and each processing tool for die frames may be coupled to a corresponding FCLP that is a frame cassette loading apparatus as disclosed above in accordance with FIGS. 1-3. In this situation, after the at least one die in the die carrier 420 is processed and the die carrier 420 is unloaded by the load port 410, the OHT vehicle 450 can pick up the die carrier 420 from the load port 410 and transport the die carrier 420 to a next load port for additional die processing at the processing tool coupled to the next load port.

Figure 5:
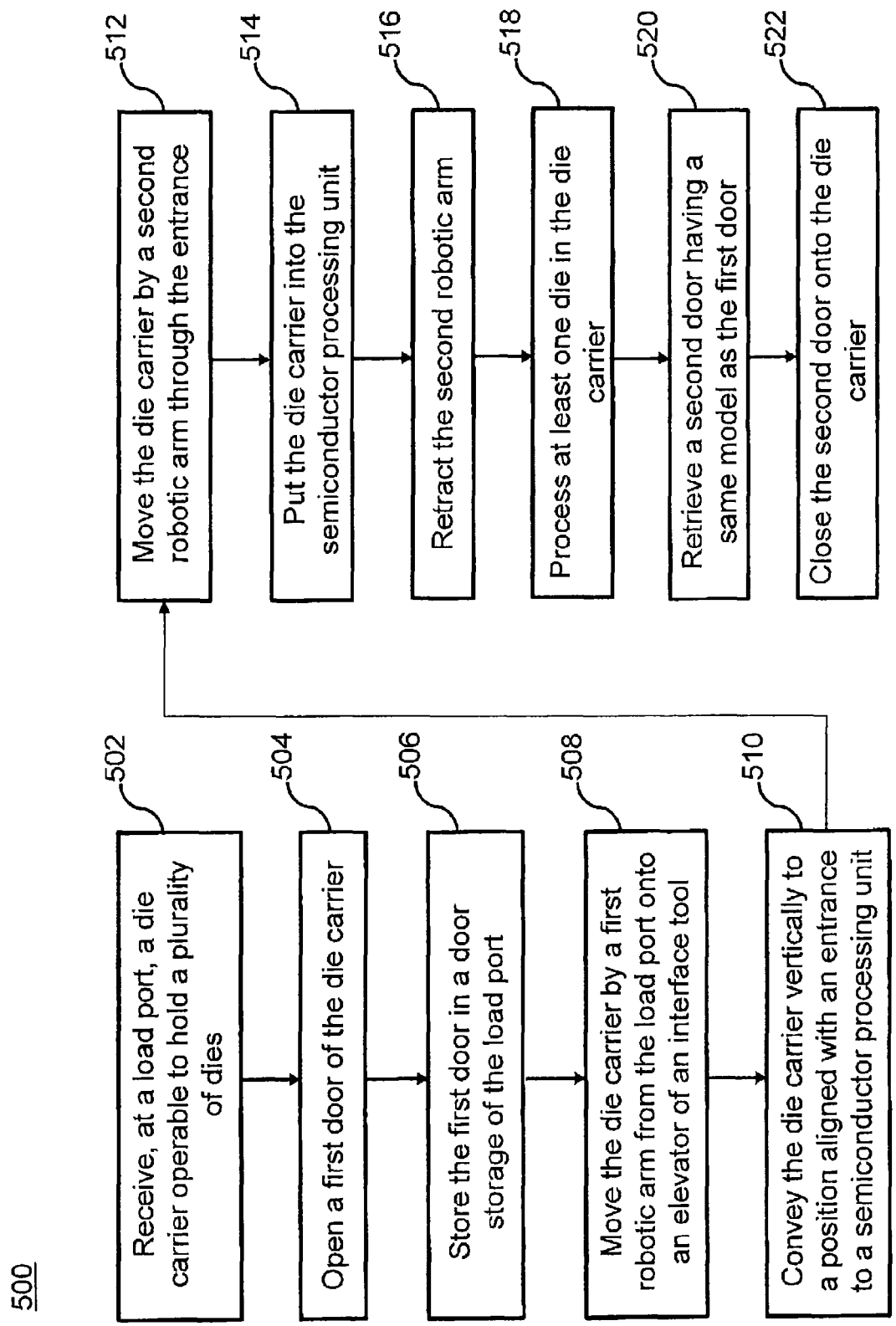
FIG. 5 is a flow chart illustrating an exemplary method for automatically handling die carriers, in accordance with some embodiments of the present disclosure.

FIG. 5 is a flow chart illustrating an exemplary method 500 for automatically handling die carriers, in accordance with some embodiments of the present disclosure. As shown in FIG. 5, at operation 502, a die carrier is received at a load port. The die carrier is operable to hold a plurality of dies. At operation 504, a first door of the die carrier is opened. The first door is stored at operation 506 in a door storage of the load port. The die carrier is moved at operation 508 by a first robotic arm from the load port onto an elevator of an interface tool. At operation 510, the die carrier is conveyed vertically by the elevator to a position aligned with an entrance to a semiconductor processing unit.

At operation 512, the die carrier is moved by a second robotic arm through the entrance. At operation 514, the die carrier is put into the semiconductor processing unit. At operation 516, the second robotic arm is retracted back to the interface tool. At least one die in the die carrier is processed at operation 518. A second door having a same model as the first door is retrieved at operation 520. At operation 522, the second door is closed onto the die carrier. The order of the operations shown in FIG. 5 may be changed according to different embodiments of the present disclosure.

In an embodiment, an apparatus for handling die carriers is disclosed. The apparatus includes: at least one load port each configured for loading a die carrier operable to hold a plurality of dies; and an interface tool coupled to the at least one load port and a semiconductor processing unit. The interface tool comprises: a first robotic arm configured for transporting the die carrier from the at least one load port to the interface tool, and a second robotic arm configured for transporting the die carrier from the interface tool to the semiconductor processing unit for processing at least one die in the die carrier.

In another embodiment, a system is disclosed. The system includes: a semiconductor processing unit; at least one load port configured for loading at least one die carrier each operable to hold a plurality of dies; and an interface tool coupled to the semiconductor processing unit and to the at least one load port. The interface tool comprises: a first robotic arm configured for transporting the at least one die carrier from the at least one load port to the interface tool, and a second robotic arm configured for transporting the at least one die carrier from the interface tool to the semiconductor processing unit.

In yet another embodiment, a method is disclosed. The method includes: receiving, at a load port, a die carrier operable to hold a plurality of dies; transporting, by a first robotic arm, the die carrier from the load port to an interface tool, and transporting, by a second robotic arm, the die carrier from the interface tool to a semiconductor processing unit for processing at least one die in the die carrier.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for handling die carriers, comprising:
at least one load port each configured to load a die carrier operable to hold a plurality of dies; and
an interface tool, wherein:
the interface tool is connected, via a first interface, to the at least one load port along a first direction;
the interface tool is connected, via a second interface, to a process chamber along a second direction different from the first direction; and
the interface tool comprises at least one robotic arm configured to clamp on the die carrier to swing the die carrier from the at least one load port to the interface tool, and wherein the at least one robotic arm is further configured to grab and hold the die carrier to transport the die carrier from the interface tool to the process chamber for processing at least one die in the die carrier.

2. The apparatus of claim 1, wherein the at least one load port comprises two load ports that are coupled to opposite sides of the interface tool, respectively.

3. The apparatus of claim 1, wherein the at least one robotic arm comprises a first robotic arm and a second robotic arm, and each of the first robotic arm and the second robotic arm is configured to move the die carrier horizontally and vertically.

4. The apparatus of claim 3, wherein the first robotic arm is configured to move the die carrier along a first horizontal direction.

5. The apparatus of claim 4, wherein the second robotic arm is configured to move the die carrier along a second horizontal direction that is perpendicular to the first horizontal direction.

6. The apparatus of claim 3, wherein the interface tool further comprises:
an elevator configured to move the die carrier vertically.

7. The apparatus of claim 3, wherein the die carrier is a frame cassette comprising a plurality of frames each of which is operable to hold a plurality of dies.

8. The apparatus of claim 3, wherein the at least one load port is further configured to:
open a first door of the die carrier; and
store the first door before the die carrier is transported to the interface tool.

9. The apparatus of claim 8, wherein:
the second robotic arm is further configured to transport the die carrier from the process chamber to the interface tool after the at least one die is processed;
the first robotic arm is further configured to transport the die carrier from the interface tool to the at least one load port; and
the at least one load port is further configured to retrieve a second door having a same model as the first door from the door storage, and to close the second door on the die carrier that has been transported from the interface tool to the at least one load port.

10. A system, comprising:
a process chamber;
at least one load port configured to load at least one die carrier each operable to hold a plurality of dies; and
an interface tool coupled to the process chamber and to the at least one load port, wherein the interface tool comprises:
a first interface connecting the at least one load port and the interface tool along a first direction;
a second interface connecting the interface tool and the process chamber along a second direction; and
at least one robotic arm configured to hold each of the at least one die carrier and swing the die carrier from the at least one load port to the interface tool, and wherein the at least one robotic arm is further configured to grab and hold a handle on top of each of the at least one die carrier to transport the at least one die carrier from the interface tool to the process chamber.

11. The system of claim 10, wherein the second direction is perpendicular to the first direction.

12. The system of claim 11, wherein:
the at least one robotic arm comprises a first robotic arm and a second robotic arm;
the first robotic arm is configured to move the die carrier through the first interface along a first horizontal direction; and
the second robotic arm is configured to move the die carrier through the second interface along a second horizontal direction that is perpendicular to the first horizontal direction.

13. The system of claim 11, wherein the interface tool further comprises: a third interface connecting the interface tool and the process chamber.

14. The system of claim 13, wherein:
the first end is configured to move the at least one die carrier through the first interface along a first horizontal direction; and
the at least one robotic arm is configured to move the at least one die carrier through the second interface or the third interface along a second horizontal direction that is perpendicular to the first horizontal direction.

15. The system of claim 14, wherein:
the third interface is above the second interface; and
the interface tool further comprises an elevator configured to move the at least one die carrier between the third interface and the second interface along a vertical direction that is perpendicular to both the first horizontal direction and the second horizontal direction.

16. The system of claim 10, wherein:
the first interface is above the second interface; and
the interface tool further comprises an elevator configured to move the at least one die carrier between the first interface and the second interface along a vertical direction that is perpendicular to both the first horizontal direction and the second horizontal direction.

17. The system of claim 10, wherein:
the at least one load port is configured to receive the at least one die carrier from an overhead hoist transport (OHT) vehicle.

18. A method, comprising:
receiving, at a load port, a die carrier operable to hold a plurality of dies;
transporting, by grabbing and holding a handle on top of the die carrier, the die carrier from the load port to the interface tool through a first interface, wherein the first interface connects the load port and an interface tool along a first direction; and
transporting, by clamping on the die carrier to swing the die carrier from the interface tool to a process chamber through a second interface for processing at least one die in the die carrier, wherein the second interface connects the interface tool and the process chamber along a second direction.

19. The method of claim 18, further comprising:

opening a first door of the die carrier before the die carrier is transported from the load port to the interface tool;

storing the first door in a door storage of the load port;

retrieving a second door having a same model as the first door; and closing the second door on the die carrier after the at least one die is processed.

20. The method of claim 18, wherein:

transporting the die carrier from the load port to the interface tool comprises moving the die carrier by a first robotic arm onto an elevator;

the die carrier is conveyed by the elevator vertically to a position aligned with an entrance to the process chamber; and transporting the die carrier from the interface tool to the process chamber comprises:
  moving the die carrier by a second robotic arm through the entrance;
  putting the die carrier into the process chamber; and
  retracting the second robotic arm.

* * * * *